US012750023B2

(12) United States Patent
Petroianu

(10) Patent No.: US 12,750,023 B2
(45) Date of Patent: Sep. 29, 2026

(54) PRECISION OPERATIONAL AMPLIFIER WITH A FLOATING INPUT STAGE

(71) Applicant: SEMICONDUCTOR COMPONENTS INDUSTRIES, LLC, Scottsdale, AZ (US)

(72) Inventor: Catalin Ionut Petroianu, Bucharest (RO)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 392 days.

(21) Appl. No.: 18/262,626

(22) PCT Filed: Mar. 14, 2022

(86) PCT No.: PCT/US2022/071122
§ 371 (c)(1),
(2) Date: Jul. 24, 2023

(87) PCT Pub. No.: WO2022/198184
PCT Pub. Date: Sep. 22, 2022

(65) Prior Publication Data
US 2024/0097631 A1 Mar. 21, 2024

Related U.S. Application Data

(60) Provisional application No. 63/200,551, filed on Mar. 15, 2021.

(51) Int. Cl.
*H03F 3/45* (2006.01)

(52) U.S. Cl.
CPC ....... *H03F 3/45179* (2013.01); *H03F 3/4508* (2013.01); *H03F 2200/135* (2013.01); *H03F 2203/45512* (2013.01)

(58) Field of Classification Search
CPC ............... H03F 3/45179; H03F 3/4508; H03F 2200/135; H03F 2203/45512; H03F 1/302;
(Continued)

(56) References Cited

U.S. PATENT DOCUMENTS 3,423,689 A 1/1969 Miller et al.
6,998,907 B1 2/2006 Kindt et al.
(Continued)

OTHER PUBLICATIONS

Muhammed Bolatkale, et al. "A single-temperature trimming technique for MOS-input Operational Amplifiers Achieving 0.33 V/C offset drift," IEEE Journal of solid state circuits, vol. 46, No. 9, Sep. 2011, pp. 2099-2107.

(Continued)

*Primary Examiner* — Hieu P Nguyen
(74) *Attorney, Agent, or Firm* — Brake Hughes Bellermann LLP

(57) ABSTRACT

The operational amplifier disclosed includes an input stage configured to receive power from a floating supply in a low voltage range that can float according to the common mode voltage at the input. The floating supply facilitates the use of low voltage components that can improve the precision of the operational amplifier by lowering the offset voltage. The input stage includes a first gain stage including field effect transistors and a second gain stage using bipolar transistors. The gain stages can be implemented differently to accommodate different applications and fabrication capabilities.

20 Claims, 13 Drawing Sheets

(58) Field of Classification Search
CPC ........... H03F 2200/462; H03F 3/45291; H03F 3/45318; H03F 3/45807; H03F 2200/297; H03F 2200/303; H03F 2200/444; H03F 2200/481; H03F 2200/498; H03F 2203/45546; H03F 2203/45548; H03F 2203/45632; H03F 2203/45702; H03F 2203/45712; H03F 3/45475
USPC .................................................. 330/252–261
See application file for complete search history.

(56) References Cited

U.S. PATENT DOCUMENTS

| | | | | |
|---|---|---|---|---|
| 7,411,451 | B2 * | 8/2008 | Alenin ................ | H03F 3/45291 330/252 |
| 10,601,384 | B2 * | 3/2020 | Danyuk .............. | H03F 3/45475 |
| 2003/0169111 | A1 | 9/2003 | Ivanov et al. | |
| 2010/0164631 | A1 | 7/2010 | Schneider et al. | |
| 2020/0252038 | A1 | 8/2020 | Petroianu | |

OTHER PUBLICATIONS

International Search Report and Written Opinion mailed Jun. 23, 2022 for counterpart International Application No. PCT/US2022/071122, 16 pages.

* cited by examiner

PRECISION OPERATIONAL AMPLIFIER WITH A FLOATING INPUT STAGE

CROSS-REFERENCE TO RELATED APPLICATION

This application is a national phase entry of International Application No. PCT/US2022/071122 filed on Mar. 14, 2022, which claims the benefit of U.S. Provisional Application No. 63/200,551, filed on Mar. 15, 2021. The applications are hereby incorporated by reference, each in its entirety.

FIELD OF THE DISCLOSURE

The present disclosure relates to analog microelectronics and more specifically to an operational amplifier having a low offset voltage and suitable for a wide range of common mode voltages and supply voltages due to its floating input stage.

BACKGROUND

The precision of operational amplifiers may be negatively affected by offset voltage. Offset voltage is a small voltage that appears at the output of an operational amplifier when zero volts is expected, such as when the inputs are equal voltage. The offset voltage can be due to mismatches in differential circuits, such as a differential pair. The mismatches may be between fabricated transistor elements (i.e., fingers) included within a single transistor or may be between a pair of different transistors in a differential pair. Increasing a physical device size (i.e., die area) of a transistor may be used to minimize mismatches and therefore reduce an offset voltage on average for the operational amplifier in production. Accordingly, a desire for high precision (i.e., low offset voltage) may contrast with a desire for small size. This contrast may be enhanced when high-voltage operation is desired because larger device sizes are required to handle the high-voltages. Chopping or trimming techniques may be used to reduce offset voltage but these techniques can add cost and complexity to an operational amplifier and therefore may not be suitable for some applications.

SUMMARY

In some aspects, the techniques described herein relate to an input stage for an operational amplifier, the input stage including: a first gain stage including: a first field effect transistor coupled at a first gate to a positive input of the operational amplifier; and a second field effect transistor coupled at a second gate to a negative input of the operational amplifier; and a second gain stage including: a first bipolar transistor coupled at a first emitter to a negative output of the first gain stage and coupled at a first collector to a negative output of the input stage; and a second bipolar transistor coupled at a second emitter to a positive output of the first gain stage and coupled at a second collector to a positive output of the input stage.

In some aspects, the techniques described herein relate to an input stage for the operational amplifier, wherein: a first base of the first bipolar transistor is directly connected to a second base of the second bipolar transistor, a connection between the first base and the second base forming a bias node for the second gain stage.

In some aspects, the techniques described herein relate to an input stage for the operational amplifier, wherein: the bias node for the second gain stage is at a voltage that floats relative to a voltage of the first gain stage.

In some aspects, the techniques described herein relate to an input stage for the operational amplifier, wherein the first gain stage is inverting, and the second gain stage is non-inverting.

In some aspects, the techniques described herein relate to an input stage for the operational amplifier, wherein the second gain stage further includes: a first cascode transistor coupled between the first collector and the negative output of the input stage; and a second cascode transistor coupled between the second collector and the positive output of the input stage.

In some aspects, the techniques described herein relate to an input stage for the operational amplifier, wherein: a first source of the first field effect transistor is directly coupled to a second source of the second field effect transistor, a connection between the first source and the second source forming a common source node of the first gain stage; a first drain of the first field effect transistor is coupled to a floating node of the first gain stage via first resistor; and a second drain of the second field effect transistor is coupled to the floating node of the first gain stage via a second resistor, the common source node and the floating node coupled to a floating supply.

In some aspects, the techniques described herein relate to an input stage for the operational amplifier, wherein: the first field effect transistor and the second field effect transistor are PMOS transistors; and the input stage is configured to transmit a positive voltage (FP) from the common source node to the floating supply and receive a negative voltage (FN) from the floating supply at the floating node, the negative voltage (FN) lower than the positive voltage (FP) by a low-voltage supply voltage.

In some aspects, the techniques described herein relate to an input stage for the operational amplifier, further including a current source configured to supply current to the common source node from an upper rail.

In some aspects, the techniques described herein relate to an input stage for the operational amplifier, wherein: the first field effect transistor and the second field effect transistor are NMOS transistors; and the input stage is configured to transmit a negative voltage (FN) from the common source node to the floating supply and receive a positive voltage (FP) from the floating supply at the floating node, the positive voltage (FP) higher than the negative voltage (FN) by a low voltage.

In some aspects, the techniques described herein relate to an input stage for the operational amplifier, further including a current source configured to drain current from the common source node to a lower rail.

In some aspects, the techniques described herein relate to an input stage for the operational amplifier, wherein the second gain stage further includes an active load coupled to the first collector of the first bipolar transistor and the second collector of the second bipolar transistor.

In some aspects, the techniques described herein relate to an input stage for the operational amplifier, wherein: the first bipolar transistor and the second bipolar transistor are NPN transistors; and the active load is coupled between an upper rail voltage (VDD) and the first bipolar transistor and the second bipolar transistor.

In some aspects, the techniques described herein relate to an input stage for the operational amplifier, wherein: the first bipolar transistor and the second bipolar transistor are PNP transistors; and the active load is coupled between a lower rail voltage (GND) and the first bipolar transistor and the second bipolar transistor.

In some aspects, the techniques described herein relate to an input stage for the operational amplifier, wherein the active load includes: a third bipolar transistor coupled at a third emitter to a third resistor and coupled at a third collector to the negative output of the input stage, and a fourth bipolar transistor coupled at a fourth emitter to a fourth resistor and coupled at a fourth collector to the positive output of the input stage.

In some aspects, the techniques described herein relate to an operational amplifier including: an input stage including: a first differential pair including field effect transistors source terminals connected together at a common source node of the input stage, a voltage at the common source node corresponding to an input voltage of the operational amplifier; a pair of resistors coupled between drain terminals of the first differential pair of field effect transistors, the pair of resistors connected together at a floating node of the input stage; and a second different pair including bipolar transistors coupled at emitter terminals to the pair of resistors and connected together a common base node of the input stage; and a floating supply configured to receive the voltage at the common source node and generate a relative voltage at the floating node.

In some aspects, the techniques described herein relate to an operational amplifier, wherein the voltage at the common source node and the relative voltage at the floating node power the first differential pair with a low voltage range that floats according to the input voltage of the operational amplifier.

In some aspects, the techniques described herein relate to an operational amplifier, wherein the input voltage of the operational amplifier is in a high voltage range.

In some aspects, the techniques described herein relate to an operational amplifier, wherein the floating supply includes: an input transistor coupled at a gate terminal to the common source node to receive the voltage at the common source node; a voltage device coupled between a source terminal of the input transistor and the floating node to generate the relative voltage at the floating node that is offset from the voltage at the common source node; and a regulator circuit coupled configured to sense a conduction of the input transistor and based on the conduction, control a current at the floating node.

In some aspects, the techniques described herein relate to an operational amplifier, wherein: the input transistor is a NMOS transistor and the voltage at the common source node is a negative voltage that powers the first differential pair; and the regulator circuit includes a NMOS bias transistor configured to conduct current from the floating node to a lower rail of the operational amplifier based on the conduction of the input transistor.

In some aspects, the techniques described herein relate to an operational amplifier, wherein: the input transistor is a PMOS transistor and the voltage at the common source node is a positive voltage that powers the first differential pair; and the regulator circuit includes a PMOS bias transistor configured to conduct current to the floating node from an upper rail of the operational amplifier based on the conduction of the input transistor. The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
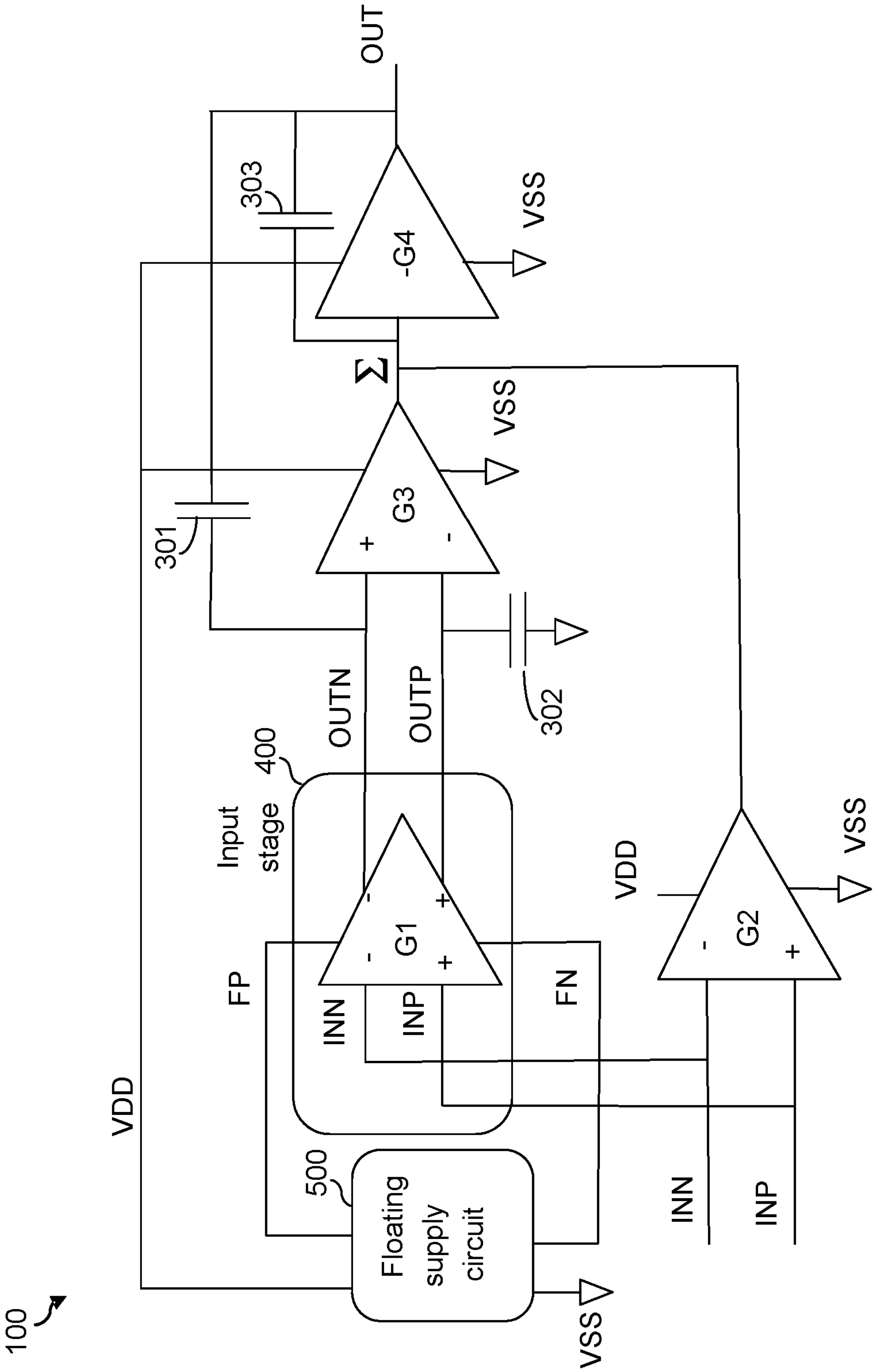
FIG. 1 is a schematic block diagram of an operational amplifier according to an implementation of the present disclosure.

The present disclosure describes an operational amplifier (opamp) that can achieve high precision without using complicated chopping circuitry and without added trimming processes to match devices. An input offset voltage (i.e., offset voltage) of an operational amplifier (i.e., opamp) may contribute to the precision of the opamp. The offset voltage ($V_{OS}$) may be defined as a differential DC voltage between the positive and negative inputs of an opamp to produce zero voltage at the output. An opamp having an offset voltage closer to zero is more precise than an opamp having an offset voltage further from zero. The offset voltage may be described in terms of an average offset and an offset standard deviation for a population of devices manufactured in production. An opamp of the present disclosure may have an average offset voltage that is approximately zero (e.g., <2

μV) and a standard deviation (σ) on the order of 100 microvolt (e.g., 100 μV). A maximum offset voltage may be the offset voltage that a portion of a production lot is at or below. For example, an opamp of the present disclosure may have a maximum offset voltage that is less than one millivolt for 6σ (i.e., 99.99966%) of the population (i.e., $-1\ \text{mV} \leq 6\sigma \leq +1\ \text{mV}$) and can be considered a low offset voltage in the descriptions of the implementations that follow.

Transistors in an amplifier that are matched may be desirable for achieving a low offset voltage. For example, transistors having the same (i.e., equal) threshold voltages ($V_T$) may be considered matched. Matching can improve for a circuit having larger devices (e.g., transistors). For example, transistors having a larger die area (i.e., larger transistors) may have less mismatch than transistors having a smaller die area (i.e., smaller transistors). Mismatches may arise due to variations in production that cause differences in the transistors. For example, a transistor may include a plurality of fingers (i.e., channels) that operate together. Mismatches can occur when these fingers are not exactly the same size and therefore operate differently. These differences tend to average out as the number of fingers increases. Accordingly, achieving higher precision may require transistors having a larger number of fingers, and this may correspond to a larger die area. For example, transistors may have ≥40 fingers with each finger having a channel length of 2-3 microns (μm) and a channel width of 30-50 μm, and transistors having these dimensions can be considered large in the descriptions of implementations that follow.

Increasing the size of the transistors used in an opamp to improve a voltage offset may become impractical for higher voltages due to size constraints. For example, a maximum input voltage requirement for an opamp can place requirements on a minimum device size used for a transistor in the opamp in order to prevent damage. In particular, a high voltage transistor may require added separation between a drain and a gate. Thus, transistors designed for high voltages (i.e., HV transistors) can be larger than transistors designed for low voltages (i.e., LV transistors). A high voltage may be considered as a voltage above 5 volts and a low voltage may be considered as a voltage less than or equal to 5 volts. High voltage opamps may have an upper rail supply voltage (i.e., upper rail voltage) that is at or above the highest voltage expected at an input. For a rail-to-rail opamp a maximum input voltage may be approximately equal to the upper rail supply voltage (i.e., $V_{DD}$) of the opamp. The present disclosure describes an opamp that (i) has a low offset voltage and/or (ii) can accept a range of input voltages that includes high voltages. For example, in implementations referred to in the disclosure, the opamp can have a lower rail voltage (i.e., $V_{SS}$) that is equal to 0V (i.e., ground), an upper rail voltage (i.e., $V_{DD}$) that is equal to 40V, and an input voltage (e.g., common mode voltage) that is a voltage in a range between the upper rail voltage and the lower rail voltage.

FIG. 1 is a schematic block diagram of an operational amplifier according to an implementation of the present disclosure. The opamp 100 includes an input stage 400 that has a low offset voltage and a high gain (e.g., $V_{OUT}/V_{IN}$). A high gain can be a gain greater than 1000 V/V. For the example implementations disclosed, the input stage can have an (overall) gain that is in a range of $3000 \leq G \leq 4000$ V/V).

A high gain can make the input stage 400 the most significant source of offset voltage because the effects on the offset voltage from subsequent stages are reduced (e.g., divided) by the gain of the input stage 400. Accordingly, the offset voltage of the opamp 100 can be approximately equal to the offset voltage of the input stage 400.

A gain block, in a chain of gain stages, can be defined where a signal undergoes an inversion (i.e., a pole is introduced). The opamp of the present disclosure has an input stage 400 that includes a single gain block, referred to as the first gain block (G1). The first gain block (G1) is inverting (i.e., output is inverted), and therefore, the input stage 400 includes one pole in its frequency response. The stability of the opamp may be improved by providing feedback (i.e., compensation) to the locations of the signal inversion. Accordingly, the opamp 100 includes compensation capacitors 301, 302 to provide unity gain stability to the input stage 400. When the input stage 400 includes only one gain block (i.e., first gain block (G1)), as shown in the FIG. 1, the terms "first gain block" (i.e., G1) and "input stage" may be used interchangeably.

The opamp 100 receives a positive input (INP) and a negative input (INN) (i.e., a differential input). The differential input (i.e., INP, INN) is coupled to two paths. In other words, the opamp is a two-path opamp. The two paths include a high-gain signal path and a low-gain signal path. The high-gain signal path (i.e., high-gain path) has a lower bandwidth (i.e., is slower) than the low-gain signal path (i.e., low-gain path), which has a higher bandwidth (i.e., is faster). The high-gain path includes the input stage 400 (i.e., first gain block (G1)), a third gain block (G3) and a fourth gain block (G4). The third gain block (G3) can be configured to generate a high-gain single-ended signal based on a differential output (OUTN, OUTP) of the first gain block (G1). The low gain path includes a second gain block (G2) and the fourth gain block (G4). The second gain block can be configured to generate a low-gain single-ended signal based on a differential input (INP, INN) of the operational amplifier. A high-gain single-ended signal at the output of the third gain block (G3) is combined with a low-gain single-ended signal at the output of the second gain block (G2) at a summing node (Σ). The fourth gain block (G4) can be configured to combine the high-gain single-ended signal and the low-gain single ended signal into a combined signal. The fourth gain block (G4) can also be configured to couple the combined signal to the output (OUT) of the opamp 100. The fourth gain block (G4) is inverting. Accordingly, a compensation capacitor 303 can be used to provide unity gain stability to the fourth gain block. The combined output signal (OUT) can have an overall frequency response that is based on a frequency response of the high-gain single-ended signal and a frequency response of the low-gain single-ended signal.

As shown in FIG. 1, the first gain block (G1) is powered by a floating supply circuit (i.e., floating supply 500) that generates a positive floating voltage (i.e., positive voltage (FP)) and a negative floating voltage (i.e., negative voltage (FN)). The positive voltage (FP) and the negative voltage (FN) may span a low-voltage (LV) range (e.g., $1\text{V} \leq \text{FP-FN} \leq 5\text{V}$). The second gain block (G2), the third gain block (G3), and the fourth gain block (G4) are powered by a fixed power supply (i.e., fixed supply) of the opamp. The fixed supply can be configured to supply an upper rail voltage (VDD) and a lower rail voltage (VSS) to the opamp. The upper rail voltage (VDD) and the lower rail voltage (VSS) may span a high-voltage (HV) range (e.g., $5 \leq \text{VDD-VSS}$).

Figure 2:
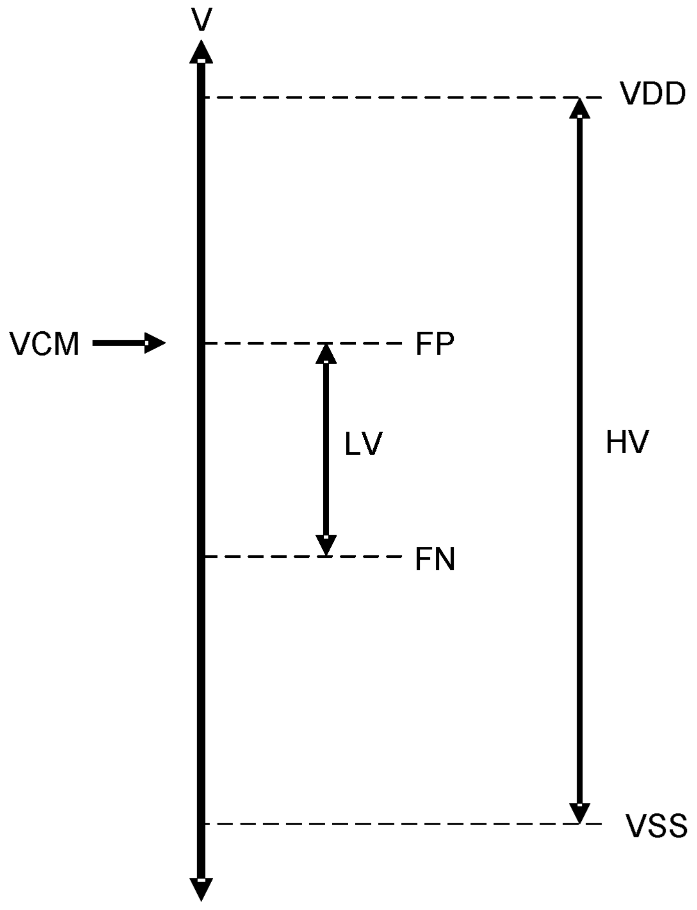
FIG. 2 graphically illustrates the relationship between the floating voltage supply and the fixed voltage supply according to a possible implementation of the present disclosure.

FIG. 2 graphically illustrates a possible relationship between the floating supply voltage (FP-FN) and the fixed supply voltage (VDD-VSS) according to a possible implementation of the present disclosure. As mentioned, the fixed supply voltage can be used to power the second gain block (G2), the third gain block (G3), and the fourth gain block (G4). Accordingly, these gain blocks may use HV devices. The first gain block (G1) can be powered by the floating supply. Accordingly, this gain block may use LV devices.

The floating supply may provide a number of technical advantages. First, when the fixed supply includes high voltages, the floating supply can effectively shield the LV devices from the high voltages that could otherwise damage the devices. Second, the floating supply can provide a benefit by ensuring a constant bias to the LV devices despite variations in the fixed supply (i.e., supply). For example, the positive voltage (FP) and the negative voltage (FN) can be set to values corresponding to the positive input (INP) and/or negative input (INP) so that the LV transistors of the first gain block (G1) are in strong inversion for amplification.

As shown in FIG. 2, the positive voltage (FP) (or the negative voltage (FN)) of the floating supply can be set to a common mode voltage (VCM) of the input (INP, INN). A floating supply range (i.e., FP-FN) may be fixed while the positive voltage (FP) and the negative voltage (FN) may shift within the fixed supply range (i.e., VDD-VSS) according to the common mode voltage, which corresponds to the input voltage. This shift of the LV range according to the input voltage is referred to as floating.

Figure 3A:
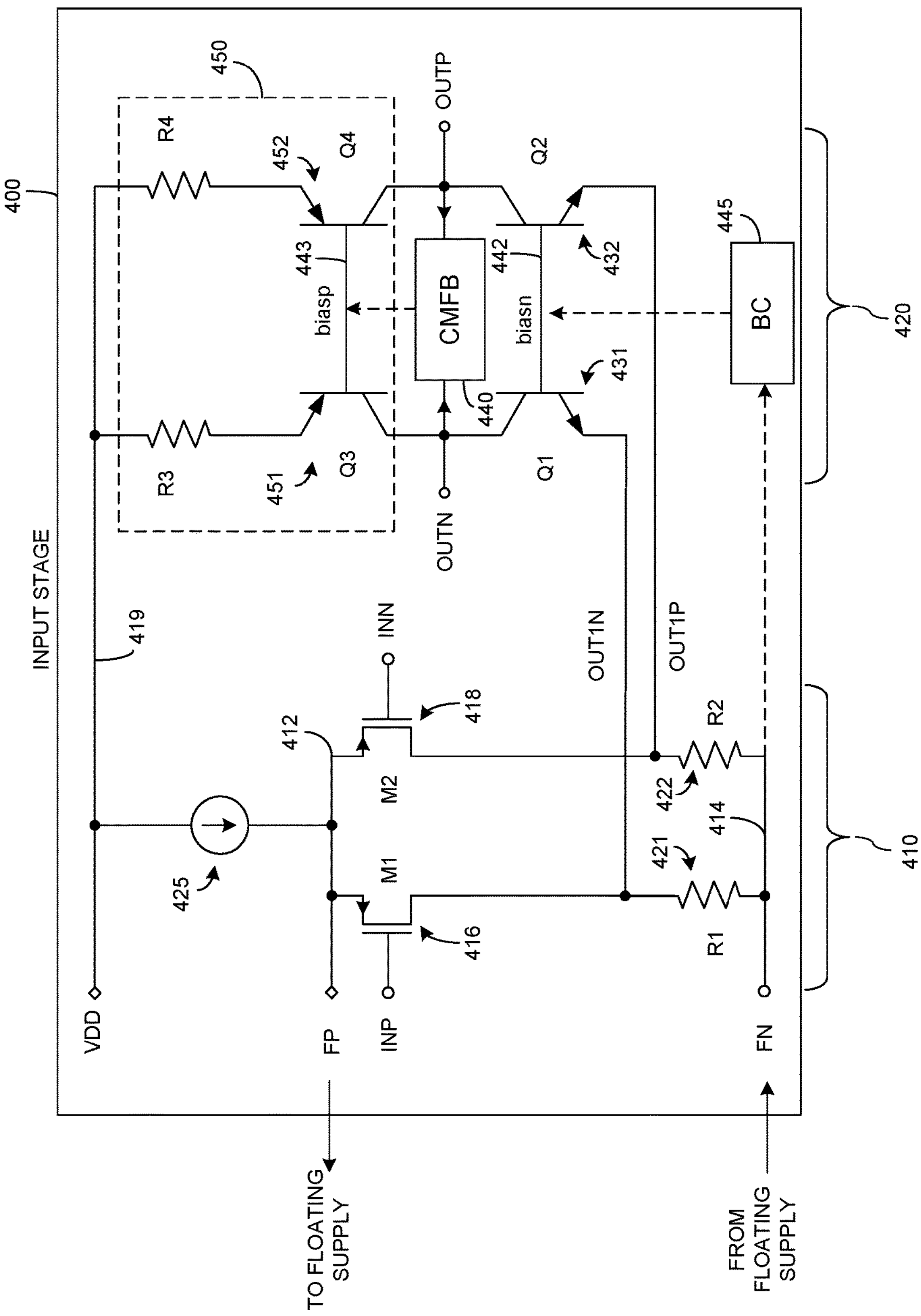
FIG. 3A is a schematic of a possible input stage for the operational amplifier of FIG. 1 according to a first implementation of the present disclosure.
Figure 3B:
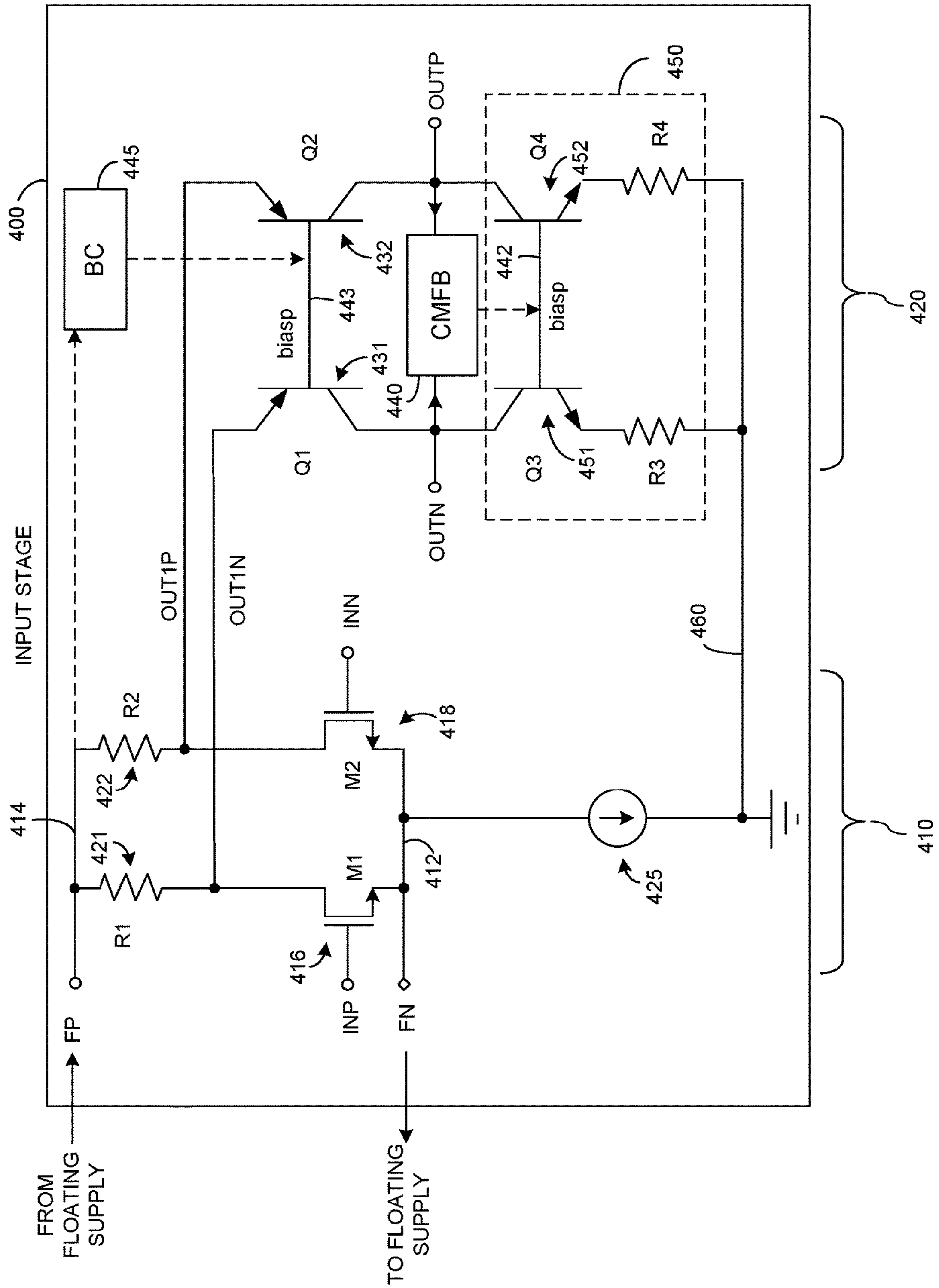
FIG. 3B is a schematic of a possible input stage for the operational amplifier of FIG. 1 according to a second implementation of the present disclosure.

FIG. 3A is a schematic of an input stage for the operational amplifier of FIG. 1 according to a first possible implementation. The input stage 400 includes a first gain stage 410 that includes a first differential pair of field effect transistors (M1, M2). The field effect transistors may be matched (e.g., the same size, the same threshold voltage) to provide a low offset voltage. Further the field effect transistors can be rated for low voltage operation (i.e., low voltage devices). The field effect transistors of the first gain stage 410 may be N-type metal oxide semiconductor transistors (i.e., NMOS transistors) or P-type metal oxide semiconductor transistors (i.e., PMOS transistors). FIG. 3A illustrates a first gain stage 410 using PMOS transistors, while FIG. 3B illustrates a first gain stage 410 using NMOS transistors.

The first gain stage 410 shown in FIG. 3A includes a first field effect transistor 416 (i.e., first PMOS transistor). The first field effect transistor is coupled at a first gate terminal (i.e., first gate) to a positive input (INP) of the operational amplifier. The first field effect transistor is coupled at a first source terminal (i.e., first source) to a common source node 412. The first field effect transistor is coupled at a first drain terminal (i.e., first drain) to a negative output (OUT1N) of the first gain stage 410.

The first gain stage 410 further includes a second field effect transistor 418 (i.e., second PMOS transistor). The second field effect transistor is coupled at a second gate terminal (i.e., second gate) to a negative input (INN) of the operational amplifier. The second field effect transistor is coupled at a second source terminal (i.e., second source) to the common source node 412. The second field effect transistor is coupled at a second drain terminal (i.e., second drain) to a positive output (OUT1P) of the first gain stage 410.

The first gain stage 410 is inverting because the negative output (OUT1N) of the first gain stage corresponds to the transistor coupled to the positive input (INP) and the positive output (OUT1P) of the first gain stage corresponds to the transistor coupled to the negative input (INN).

The first gain stage 410 shown in FIG. 3A further includes a current source 425 coupled between an upper rail 419 of the opamp and the common source node 412. The current source 425 is configured to supply current to the common source terminals of first field effect transistor 416 and the second field effect transistor 418 (i.e., M1, M2). The current source 425 is further configured to provide a voltage drop from an upper rail voltage (VDD) to a voltage at the common source node 412. This voltage drop can change as the positive voltage (FP) floats. The voltage drop can protect the first field effect transistor and the second field effect transistor, which are rated for low voltages, from damage when the upper rail voltage is a high voltage.

The first gain stage 410 shown in FIG. 3A further includes a first resistor 421 (R1) and a second resistor 422 (R2) that are coupled between the first differential pair (M1, M2) and a floating node 414. A gain of the first gain stage 410 may be set by the resistance resistors. The first resistor 421 is coupled between the first drain of the first field effect transistor 416 and the floating node 414. The second resistor 422 is coupled between the second drain of the second field effect transistor 418 and the floating node 414. The resistors may be matched (e.g., equal resistance) so that the current through each transistor in the first differential pair is substantially the same (i.e., matched). The matching precision may be based on a type of resistor used. For example, thin film resistors may be used to provide more precision than a polysilicon resistor. Either type may be used in the first gain stage 410.

The first gain stage 410 can provide a low offset voltage for a few reasons. First, the size of the LV transistors in the first differential pair (M1, M2) can be made relatively large in a die area compared to a size of HV transistors in the same die area. Second, the discrete resistors of the first gain stage (R1, R2) can be made very accurately compared to other resistor types, such as active resistors.

The use of LV transistors may offer additional advantages as well. For example, LV transistors have a higher transconductance gain than HV transistors. Noise (e.g., thermal noise) at the input of the opamp may be reduced (e.g., divided) by the transconductance (gm) of the LV gain blocks. When the transconductance gain is higher this noise is lower (e.g., 70 nV/√Hz)@10 Hz). Further flicker noise may be lower (e.g., 1.6 μVpp for 0.1 Hz to 10 Hz) in LV transistors than high voltage transistors. Noise and voltage offset at the input of the opamp from later gain stages (blocks) may be reduced by the gain of the first gain stage 410. Accordingly, the first gain stage can be the main contributor to noise and offset voltage.

The gain of the first gain stage 410 may be limited, however, by a maximum resistance of the first resistor 421 and the second resistor 422. Increasing the resistance to increase gain also raises the drain voltage on the transistors. An increase of the drain voltage could change the operating states (e.g., saturation) of the first field effect transistor 416 and/or the second field effect transistor 418 for a low input voltage. Additionally, increasing the gain of the first gain stage can require an increase in a size of the compensation capacitors 301, 302 used to stabilize the output of the input stage. The disclosed input stage for an operational amplifier can create an effective gain for the input stage using a second gain stage that allows for improved noise performance without the drawbacks described above.

The common source node 412 and the floating node 414 can be coupled to a floating supply 500. For the implementation shown in FIG. 3A, the voltage at the common source node 412 is the upper voltage (i.e., positive voltage (FP)) of the floating supply, while the voltage at the floating node 414 is a lower voltage (i.e., negative voltage (FN)) of the floating supply. The floating supply may be configured to receive the positive voltage (FP) and generate the negative voltage (FN) relative to the positive voltage (i.e., a relative voltage).

The voltage at the common source node is related to the input voltage of the opamp. In other words, the voltage at the common source node (i.e., FP) may be the common mode voltage (VCM), as shown in FIG. 2. The common mode voltage (VCM) at the input may correspond to the positive input (INP) or the negative input (INN) depending on the conduction of the field effect transistors. If the positive input voltage (INP) is greater than the negative input voltage (INN), then the second field effect transistor 418 conducts and the positive voltage (FP) will be the negative input voltage (INN) plus a gate-to-source voltage (VGS) of the second field effect transistor 418. If, on the other hand, the positive input voltage (INP) is less than the negative input voltage (INN), then the first field effect transistor 416 will conduct, and the positive voltage (FP) will be the positive input voltage (INP) plus a gate-to-source voltage (VGS) of the first field effect transistor 416. Thus, the common mode voltage (VCM) at the input may be defined by the equation below.

$$VCM = \min(INP, INN) + VGS \tag{1}$$

As shown in FIG. 3A, the input stage 400 further includes a second gain stage 420. The second gain stage 420 includes a second differential pair of transistors (Q1, Q2). The second differential pair of transistors are bipolar junction transistors (i.e., bipolar transistors). A bipolar transistor may inherently have a lower offset than a field effect transistor. Accordingly, the use of bipolar transistors can lower the offset contribution from the second gain stage 420. The second differential pair of transistors (Q1, Q2) can be NPN-type and are matched for a low offset voltage. The second gain stage 420 further includes an active load 450 to provide gain for the second gain stage 420.

The second gain stage 420 includes a first bipolar transistor 431. The first bipolar transistor 431 is coupled at a first emitter terminal (i.e., first emitter) to a negative output (OUT1N) of the first gain stage 410. The first bipolar transistor 431 is coupled at a first base terminal (i.e., first base) to a bias node (i.e., negative bias node 442). The first bipolar transistor 431 is coupled at a first collector terminal (i.e., first collector) to a negative output (OUTN) of input stage 400.

The second gain stage 420 further includes a second bipolar transistor 432 that is coupled at a second emitter terminal (i.e., second emitter) to a positive output (OUT1P) of the first gain stage 410. The second bipolar transistor 432 is coupled at a second base terminal (i.e., second base) to the negative bias node 442 The second bipolar transistor 432 is coupled at a second collector terminal (i.e., second collector) to a positive output (OUTP) of the input stage 400.

The second gain stage 420 is non-inverting because the negative output (OUT1N) of the first gain stage 410 is corresponds to the negative output (OUTN) of the input stage 400 and the positive output (OUT1P) of the first gain stage 410 corresponds to the positive output (OUTP) of the input stage.

The first bipolar transistor 431 and the second bipolar transistor 432 have their base terminals coupled together at a negative bias node 442. The negative bias node 442 can be coupled to a bias circuit 445. The bias circuit can be configured to receive a voltage from the first gain stage 410 and to generate a negative bias voltage (biasn) at the negative bias node 442. The negative bias voltage can float relative to a voltage of the first gain stage 410. For example, the negative bias voltage (biasn) may correspond to the negative voltage (FN) at the floating node 414 of the first gain stage 410. In particular the negative bias voltage (biasn) may be greater than the positive output (OUT1P) and the negative output (OUT1N) of the first gain stage 410.

The active load 450 includes a third bipolar transistor 451 (Q3). The third bipolar transistor 451 is coupled at a third collector terminal (i.e., third collector) to a negative output (OUTN) of the input stage 400. The third bipolar transistor 451 is coupled at a third base terminal (i.e., third base) to a bias node (i.e., positive bias node 443). The third bipolar transistor 451 is coupled at a third emitter terminal (i.e., third emitter) to a third resistor (R3).

The active load 450 includes a fourth bipolar transistor 452 (Q4). The fourth bipolar transistor 452 is coupled at a fourth collector terminal (i.e., fourth collector) to a positive output (OUTP) of the input stage 400. The fourth bipolar transistor 452 is coupled at a fourth base terminal (i.e., fourth base) to the positive bias node 443. The fourth bipolar transistor 452 is coupled at a fourth emitter terminal (i.e., fourth emitter) to a fourth resistor (R4). The third resistor and the fourth resistors can lower a noise contribution of the active load and can lower a current mismatch between the positive/negative sides of the second differential pair.

The third bipolar transistor 451 and the fourth bipolar transistor 452 have their base terminals coupled together at a positive bias node 443. The second differential pair may be referred to as a common-base amplifier. The positive bias node 443 can be coupled to a common mode feedback circuit 440.

The common mode feedback (CMFB) circuit can be configured to receive a voltage from the positive output (OUTP) and the negative output (OUTN) of the input stage and to generate a positive bias voltage (biasp) on the gates of the third and fourth bipolar transistors, which are P-type in the implementation shown, in order to bias the transistors so that a common mode of the output (OUTN, OUTP) of the input stage is maintained at a particular common mode voltage. The positive bias voltage may be a voltage that does not float (e.g., constant voltage). The particular common mode voltage at the output of the input stage 400 may be selected based the requirements of a subsequent gain block in the opamp.

FIG. 3B is a schematic of a possible input stage for the operational amplifier of FIG. 1 according to a second implementation of the present disclosure. The second implementation is a complement to the first implementation. For example, the common mode voltage (i.e., based on INP or INN) may set the negative voltage (FN) of the floating supply so that the floating supply can generate a positive voltage (FP) at a relative voltage above the negative voltage. A voltage difference between the negative voltage (FN) and a lower rail voltage (e.g., shown in FIG. 3B as ground) may be taken by the current source coupled between the differential pair and the lower rail 460. Further aspects of the second implementation of FIG. 3B, which may be different from the first implementation, are described below.

For the implementation shown in FIG. 3B, the first field effect transistor 416 and the second field effect transistor 418 are N-type transistors. The transistors are substantially matched to produce a low offset voltage. The current source 425 is coupled between the first differential pair (M1, M2) and the lower rail 460 of the opamp. The current source 425 can be configured to drain current from the common source node to the lower rail 460.

For the implementation shown in FIG. 3B, the voltage at the common source node 412 is the lower voltage (i.e., negative voltage (FN)) of the floating supply, while the voltage at the floating node 414 is the upper voltage (i.e., positive voltage (FP)) of the floating supply. In this implementation, the floating supply may be configured to receive the positive voltage (FN) and generate the negative voltage (FP) relative to the positive voltage (i.e., a relative voltage).

For the implementation shown in FIG. 3B, the first bipolar transistor 431 and the second bipolar transistor 432 are PNP-type transistors that have their base terminals coupled together at a positive bias node 443. The positive bias node voltage (biasp) is floated relative to a voltage (e.g., FP) in the first gain stage via the bias circuit 445.

The floating supply voltages protect the field effect transistors of the first gain stage 410 from the rail voltages that could be damaging to the low-voltage field effect transistors. While the bipolar transistors of the second gain stage 420 can be configured to handler higher voltages than the field effect transistors of the first gain stage 410, in some implementations the rail voltage (VDD or VSS) and the output voltage (OUTN or OUTP) of the input stage cause a voltage drop that is high enough to cause damage to the bipolar transistors. For these implementations, cascode stages may be used to drop voltages while repeating current so that the voltages experienced by the bipolar transistors are not damaging and the current at the bipolar transistors are substantially unchanged by the cascode stages.

Figure 3C:
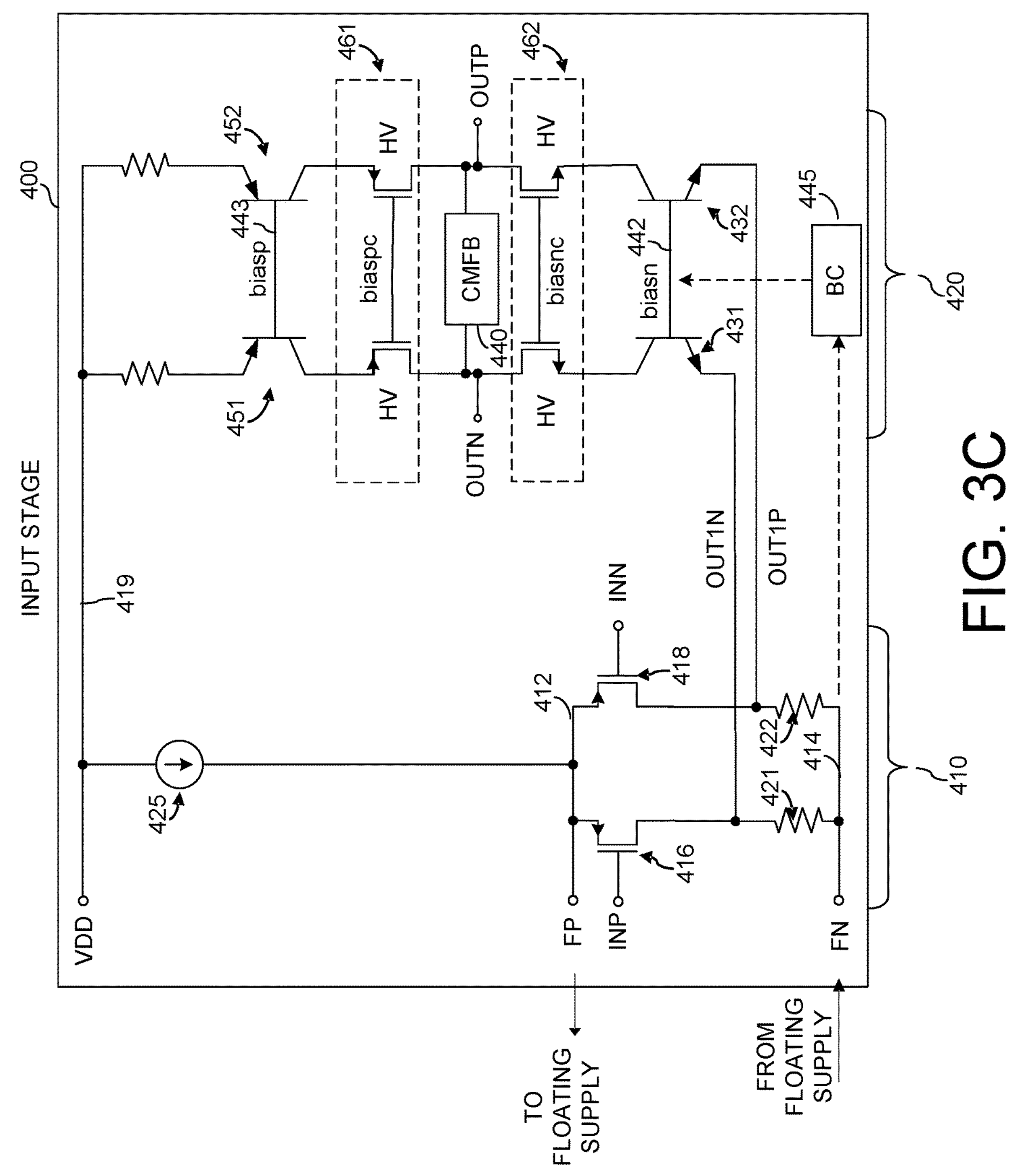
FIG. 3C is a schematic of a possible input stage for the operational amplifier of FIG. 1 according to a third possible implementation of the present disclosure.

FIG. 3C is a schematic of a possible input stage for the operational amplifier of FIG. 1 according to a third implementation of the present disclosure. The third implementation is similar to the first implementation shown in FIG. 3A but with cascode stages to protect the bipolar transistors of the second gain stage 420 from high voltages.

As shown in FIG. 3C, the second gain stage 420 includes a first cascode pair 461 coupled between the bipolar transistors of the active load (i.e., the third bipolar transistor 451 and the fourth bipolar transistor 452) and the outputs of the input stage (i.e., OUTN, OUTP). The first cascode pair 461 includes a pair of PMOS transistors with gate terminals coupled together at a positive bias cascode node where they are biased by a positive bias cascode node voltage (biaspc) generated by a bias circuit (not shown). The first cascode pair 461 is configured to provide a voltage between the outputs of the input stage (i.e., OUTP, OUTN) and the collector terminals of the third bipolar transistor 451 and the fourth bipolar transistor 452 so that a voltage between the upper rail 419 (VDD) and the outputs of the input stage (OUTN, OUTP) do not damage the third bipolar transistor 451 or the fourth bipolar transistor 452.

As shown in FIG. 3C, the second gain stage 420 further includes a second cascode pair 462 coupled between the outputs of the input stage (i.e., OUTN, OUTP) and the bipolar transistors of the second differential pair (i.e., the first bipolar transistor 431 and the second bipolar transistor 432). The second cascode pair 462 includes a pair of (high power) NMOS transistors with gate terminals coupled together at a negative bias cascode node where they are biased by a negative bias cascode node voltage (biasnc) generated by a bias circuit (not shown). The second cascode pair 462 is configured to provide a voltage between the outputs of the input stage (i.e., OUTP, OUTN) and the collector terminals of the first bipolar transistor 431 and the second bipolar transistor 432 so that a voltage between the outputs of the input stage (i.e., OUTN, OUTP) and the outputs of the first gain stage (i.e., OUT1N, OUT1P) do not damage the first bipolar transistor 431 or the second bipolar transistor 432.

Figure 3D:
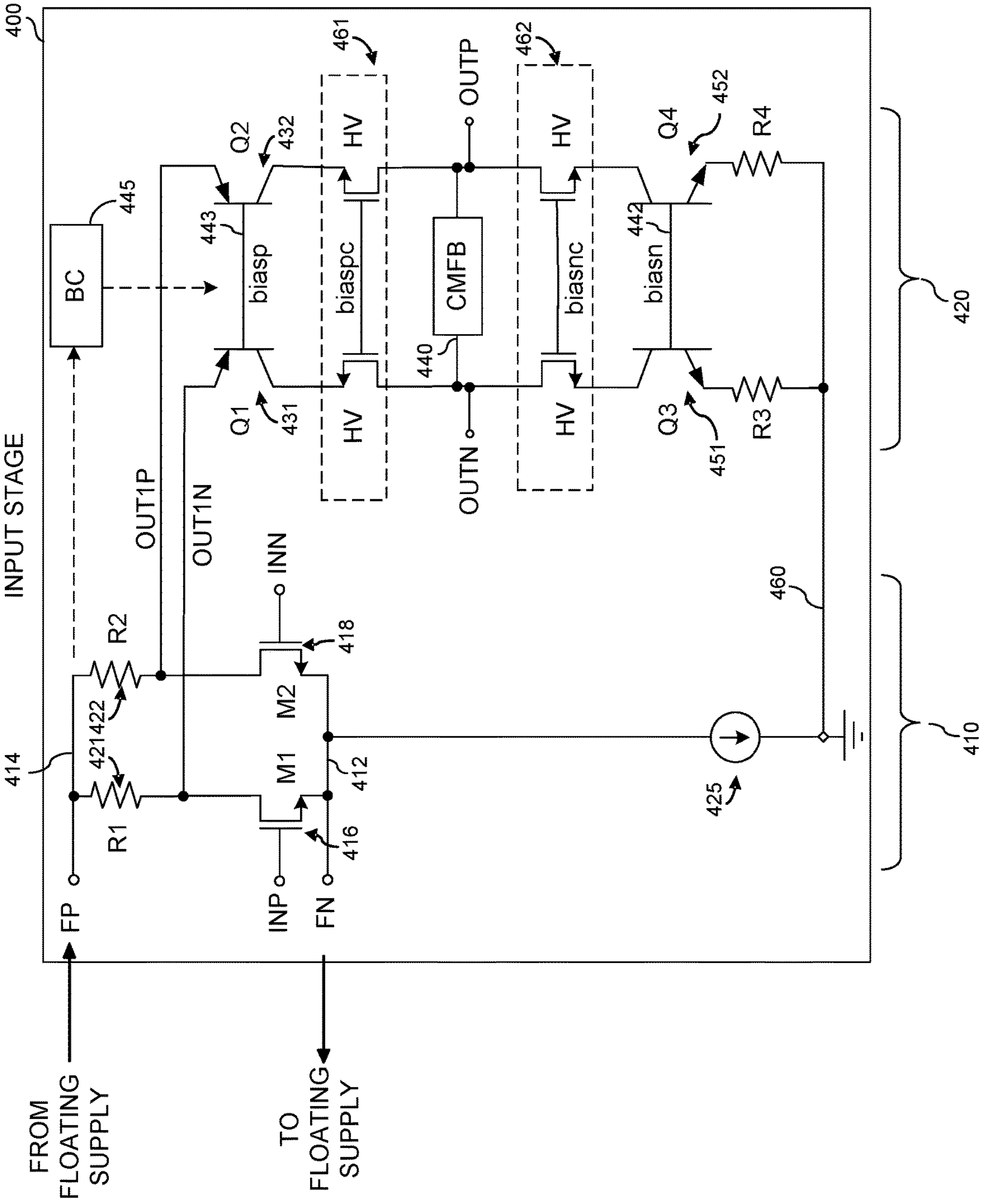
FIG. 3D is a schematic of a possible input stage for the operational amplifier of FIG. 1 according to a fourth possible implementation of the present disclosure.

FIG. 3D is a schematic of a possible input stage for the operational amplifier of FIG. 1 according to a fourth implementation of the present disclosure. The fourth implementation is similar to the second implementation, shown in FIG. 3B, and is the complement of the third implementation, shown in FIG. 3C. The fourth implementation includes cascode stages to protect the bipolar transistors of the second gain stage 420 from high voltages.

As shown in FIG. 3D, the second gain stage 420 includes a first cascode pair 461 coupled between the outputs of the input stage (i.e., OUTN, OUTP) and the bipolar transistors of the second differential pair (i.e., the first bipolar transistor 431 and the second bipolar transistor 432). The first cascode pair 461 includes a pair of (high power) PMOS transistors with gate terminals coupled together at a positive bias cascode node where they are biased by a positive bias cascode node voltage (biaspc) generated by a bias circuit (not shown). The first cascode pair 461 is configured to provide a voltage between the outputs of the input stage (i.e., OUTP, OUTN) and the collector terminals of the first bipolar transistor 431 and the second bipolar transistor 432 so that a voltage between the outputs of the input stage (i.e., OUTN, OUTP) and the outputs of the first gain stage (i.e., OUT1N, OUT1P) do not damage the first bipolar transistor 431 or the second bipolar transistor 432.

As shown in FIG. 3D, the second gain stage 420 further includes a second cascode pair 462 coupled between the bipolar transistors of the active load (i.e., the third bipolar transistor 451 and the fourth bipolar transistor 452) and the outputs of the input stage (i.e., OUTN, OUTP). The second cascode pair 462 includes a pair of NMOS transistors with gate terminals coupled together at a negative bias cascode node where they are biased by a negative bias cascode node voltage (biasnc) generated by a bias circuit (not shown). The second cascode pair 462 is configured to provide a voltage between the outputs of the input stage (i.e., OUTP, OUTN) and the collector terminals of the third bipolar transistor 451 and the fourth bipolar transistor 452 so that a voltage between the lower rail 460 (i.e., ground) and the outputs of the input stage (OUTN, OUTP) do not damage the third bipolar transistor 451 or the fourth bipolar transistor 452.

Figure 3E:
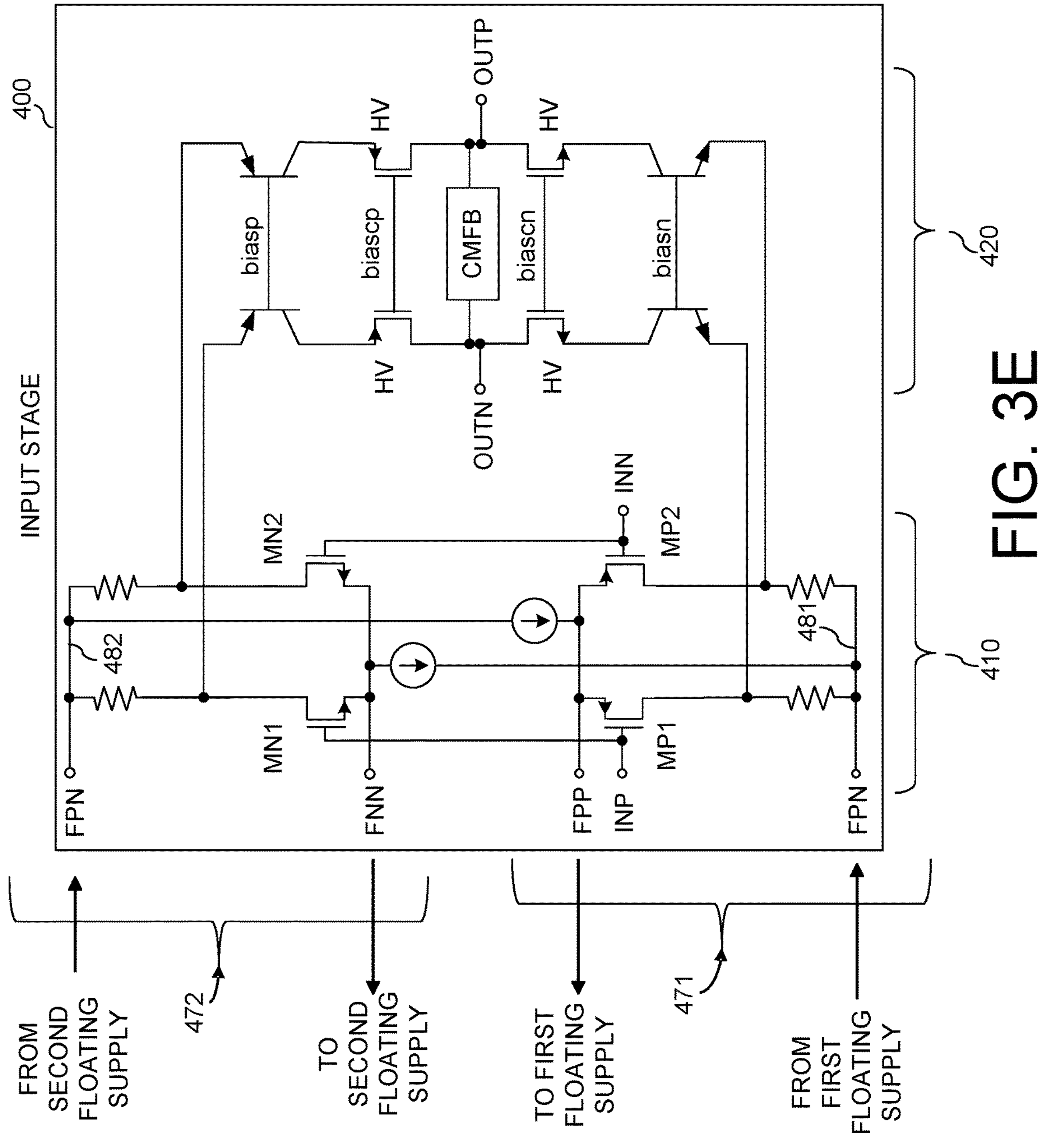
FIG. 3E is a schematic of a possible input stage for the operational amplifier of FIG. 1 according to a fifth possible implementation of the present disclosure.

FIG. 3E is a schematic of a possible input stage for the operational amplifier of FIG. 1 according to a fifth implementation of the present disclosure. The fifth implementation combines the circuits of the third implementation, shown in FIG. 3C and the fourth implementation, shown in FIG. 3D.

As shown in FIG. 3E, the first gain stage 410 of the input stage 400 can include a first portion 471 configured to set a first upper voltage (FPP) of a first floating supply (not shown) according to an input voltage (INN or INP). Based on the first upper voltage (FPP), the first floating supply can be configured to generate a first lower voltage (FNN), which is coupled to a lower floating node 481 of the first gain stage 410.

As shown in FIG. 3E, the first gain stage 410 of the input stage 400 can further include a second portion 472 configured to set a second lower voltage (FNN) of a second floating supply (not shown) according to an input voltage (INN or INP). Based on the second lower voltage (FNN), the second floating supply can be configured to generate a second upper voltage (FPN), which is coupled to an upper floating node 482 of the first gain stage 410.

Figure 4A:
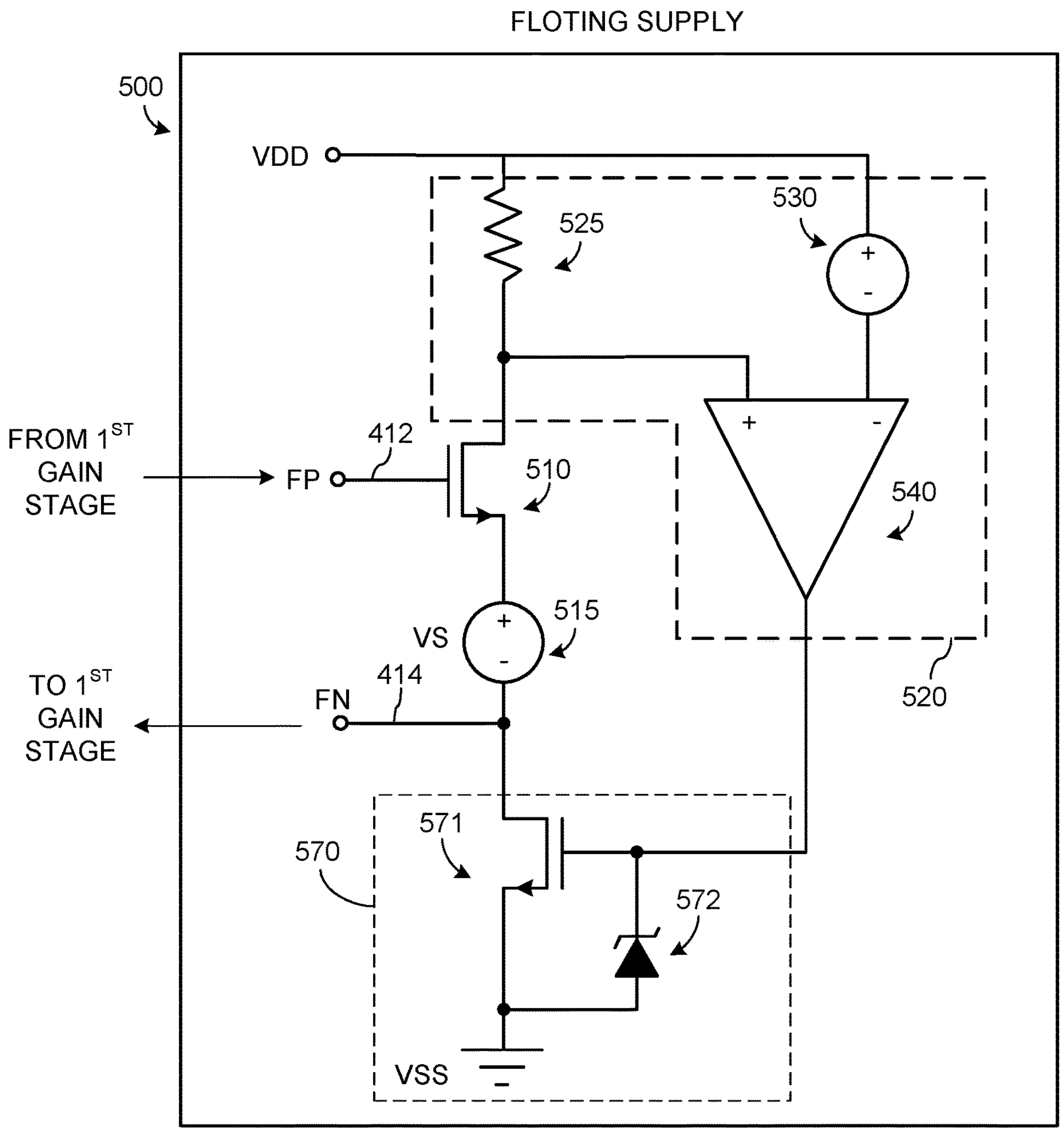
FIG. 4A is a schematic of a floating supply for the operational amplifier of FIG. 1 according to a first possible implementation of the present disclosure.

FIG. 4A is a schematic of a floating supply for the operational amplifier of FIG. 1 according to a first possible implementation. The floating supply 500 is powered by the upper rail voltage (VDD) and the lower rail voltage (VSS) of the fixed power supply. The floating supply 500 includes an input transistor 510. As shown, the input transistor 510 can be an NMOS transistor. The input transistor 510 is coupled at its gate to the common source node 412 of the first gain stage 410. Accordingly, the positive voltage (FP), at the common source node 412, is received at the gate of the input transistor 510. The input transistor 510 is coupled at its drain to the upper rail voltage (VDD) via a bias resistor 525 and is coupled at its source to a voltage source 515 (VS), which is configured to set the differential voltage of the floating supply. The voltage source 515 can be set to a low voltage. The negative voltage (FN) generated at the floating node 414 can be given by the equation below.

$$FN = FP - VGS - VS \tag{2}$$

In the equation above, VGS is the gate to source voltage of the input transistor 510 and VS is the voltage of the voltage source, which can be in the LV range (e.g., 3-5V). The positive voltage (FP) is received at the floating supply 500 from the input stage 400. The negative voltage (FN) is transmitted from the floating supply 500 to the floating node of the first gain stage 410.

The floating supply 500 further includes a control circuit 520 configured to sense a voltage corresponding to the positive voltage (FP) and to output a signal according to a difference between the positive voltage (FP) and a reference voltage (VREF). The output signal controls a regulation device 570 so that the input transistor may be biased properly (e.g., conducting) at voltages near the lower rail voltage.

The control circuit 520 includes a bias resistor 525 coupled between the drain of the input transistor 510 and the upper rail voltage (VDD). The bias resistor generates a voltage based on the positive voltage (FP) coupled to the input transistor 510. The control circuit further includes a reference source 530 to generate the reference voltage (VREF) and an amplifier 540 configured to compare the voltage on the bias resistor 525 to the reference source 530 voltage (VREF) and output a signal to control a regulation transistor 571 of the regulation device 570. The regulation transistor 571 can be turned fully ON to couple the floating node 414 to the lower rail voltage (VSS) (e.g., ground) when the input voltage (FP) is too low to properly control the negative voltage (FN). In other words, the regulation transistor can be turned ON to pull the negative voltage (FN) towards the lower rail voltage (VSS) when the input transistor turns OFF. Otherwise, the negative voltage (FN) would float because the input transistor and the voltage source (VS) do not control this sufficiently when the input transistor 510 turns OFF. Further the regulation transistor may operate as a current source that can sink current from the floating node to ground. In a possible implementation, the floating supply 500 further includes a Zener diode coupled between the gate of the regulation transistor 571 and the lower rail voltage (VSS). The Zener diode 572 is configured to clamp a maximum voltage that can appear on the regulation transistor 571 to protect it from damage.

Figure 5:
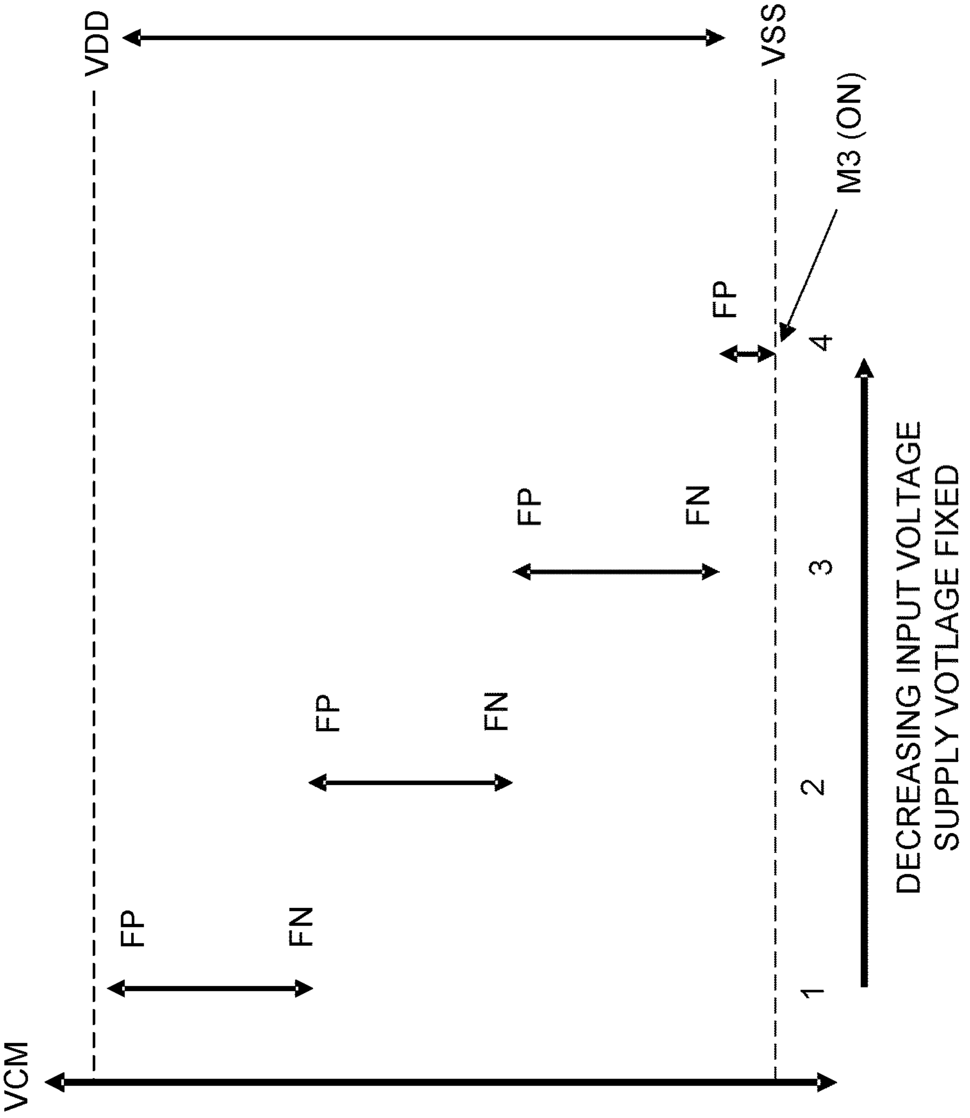
FIG. 5 graphically illustrates the relationship between the floating voltage supply and the supply voltage as an input voltage is decreased in four possible implementations of the present disclosure.

FIG. 5 graphically illustrates the relationship between the floating voltage supply and the supply voltage as an input voltage (e.g., FP) is decreased. The graph shows four possible cases. In the first case (1), the positive voltage (FP) is close to the upper rail voltage (VDD) and the span between positive voltage (FP) and the negative voltage (FN) (i.e., FP-FN) is the floating supply voltage given in the equation above (e.g., see Equation (2)). In the second case (2), the input voltage (INP) is reduced, making the positive voltage (FP) lower. The floating supply voltage (FP-FN) is the same but is shifted according to the shift in the positive voltage. In the third case (3), the input voltage (INP) is further reduced making the positive voltage (FP) even lower. The floating supply voltage (FP-FN) is the same but is shifted down according to the shift in the positive voltage. In the fourth case (4), the input voltage (INP) is further reduced making the positive voltage (FP) even lower. In the fourth case the positive voltage (FP) is below the reference voltage. As a result, the negative voltage is clamped at, or near, the lower supply rail (VSS). In the floating supply 500, this is accomplished by turning the clamping transistor ON to couple (e.g., short) the floating node 414 to the lower rail voltage. This clamping can prevent the negative voltage (FN) from floating and can extend (e.g., maximize) the span (FP-FN) of the floating supply in the low input voltage condition. The regulation transistor 571 also helps to sink current as the negative voltage FN becomes close to the lower rail voltage (VSS).

Figure 6:
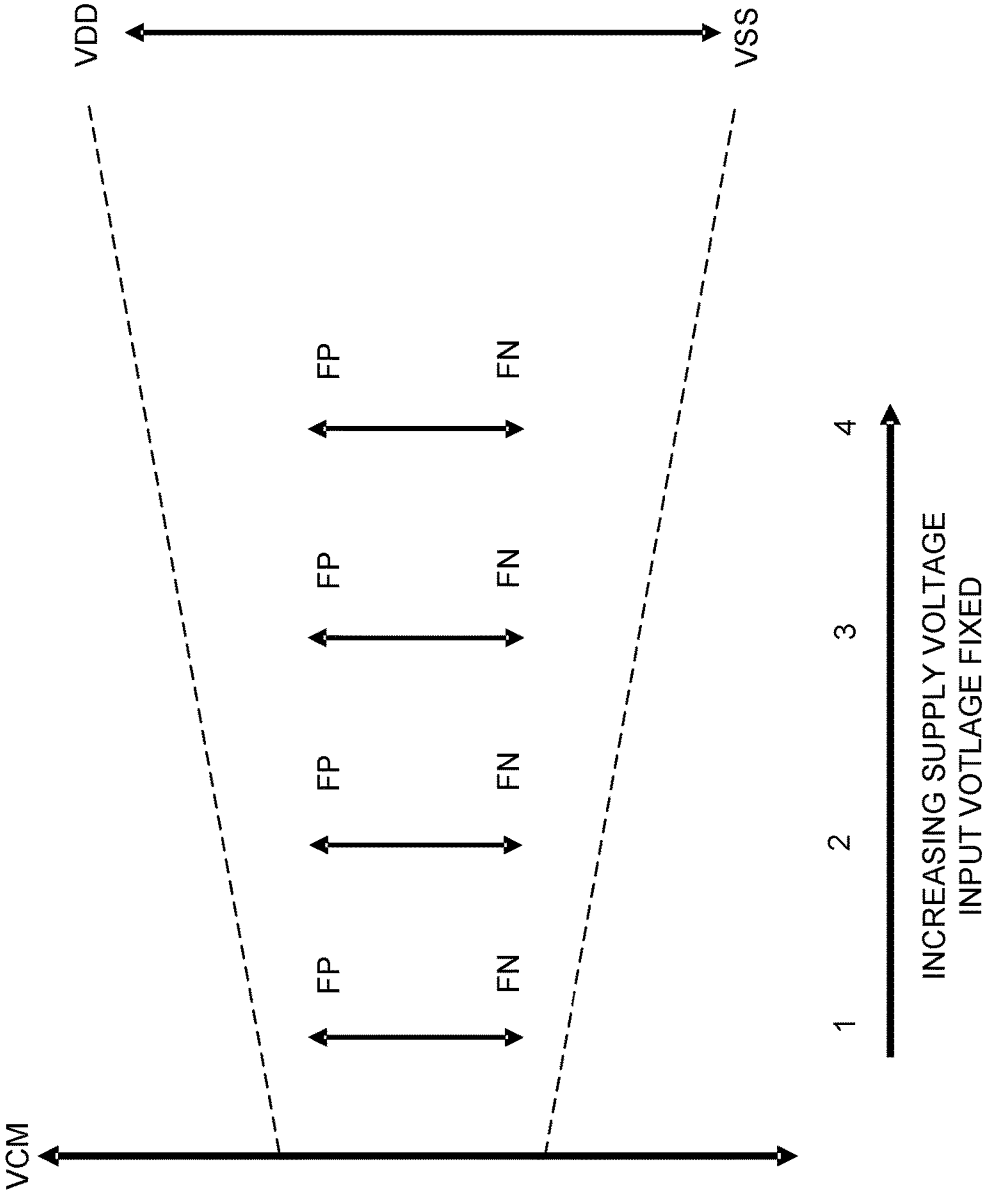
FIG. 6 graphically illustrates the relationship between the floating voltage supply and the supply voltage as the supply voltage is increased in four possible implementations of the present disclosure.

FIG. 6 graphically illustrates the relationship between the floating voltage supply and the supply voltage as the supply voltage is increased in four possible implementations of the present disclosure. The graph shows four cases. In each case (1,2,3,4) the supply voltage is increased while the input voltage (e.g., FP) is held constant. As shown, the floating supply voltage (FP-FN) is unaffected by changes to the supply voltage. Accordingly, floating supply allows the input stage 400 to have a power supply rejection ratio (PSRR) that is high (e.g., >130 dB).

Figure 4B:
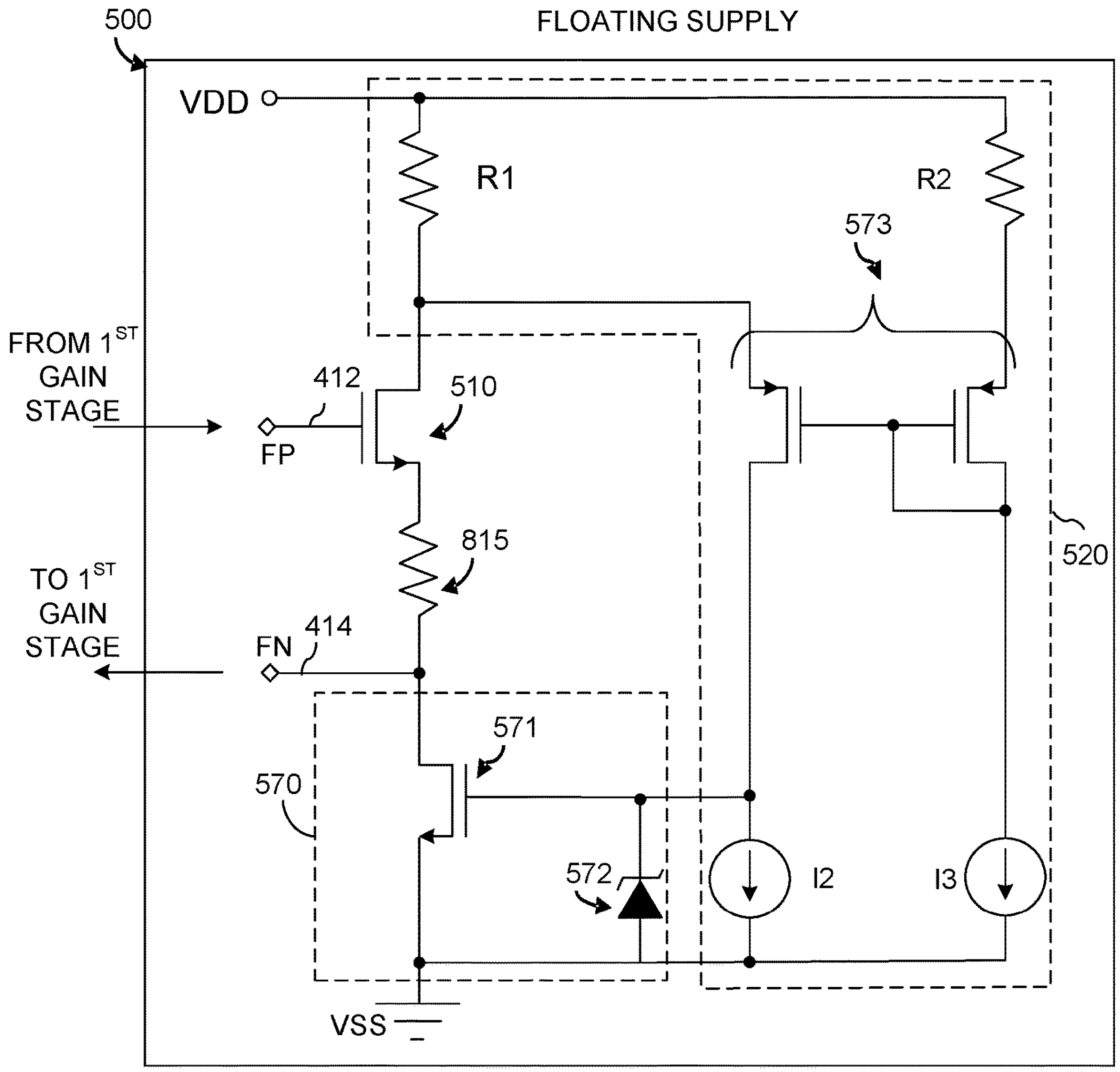
FIG. 4B is a schematic of a floating supply for the operational amplifier of FIG. 1 according to a first possible implementation of the present disclosure.

FIG. 4B is a schematic of a floating supply for the operational amplifier of FIG. 1 according to a second possible implementation. As before, the floating supply 500 includes an input transistor 510 coupled at its gate terminal to the common source node 412 so that it is controlled by the positive voltage (FP) and a regulation device 570 that include a regulation transistor configured to maintain operation of the input transistor even as the positive voltage (FP) fluctuates. The floating supply of the second implementation includes a control circuit 520 that is implemented differently from the first implementation shown in FIG. 4A.

As shown in FIG. 4B, the floating supply 500 includes a control circuit 520 configured to compare a voltage corresponding to the positive voltage (FP) to a threshold and to turn the regulation transistor 571 ON when the voltage satisfies a criterion (e.g., crosses a threshold). In the implementation shown, the control circuit 520 includes a current mirror 573 fed by a pair of matched current sources (I2, I3). The gate voltage of the regulation transistor 571 is determined by the voltage difference between the resistors R1 and R2. The voltage source fixing the voltage between the common source node 412 and the floating node 414 is implemented with a resistor 815 in the second implementation.

The first implementation of the floating supply (i.e., FIG. 4A) and the second implementation of the floating supply (i.e., FIG. 4B) are suitable for use with the first implementation of the input stage (i.e., FIG. 3A) or the third implementation of the input stage (i.e., FIG. 3C) or as the first floating supply in the fifth implementation of the input stage (i.e., FIG. 3E).

Figure 4C:
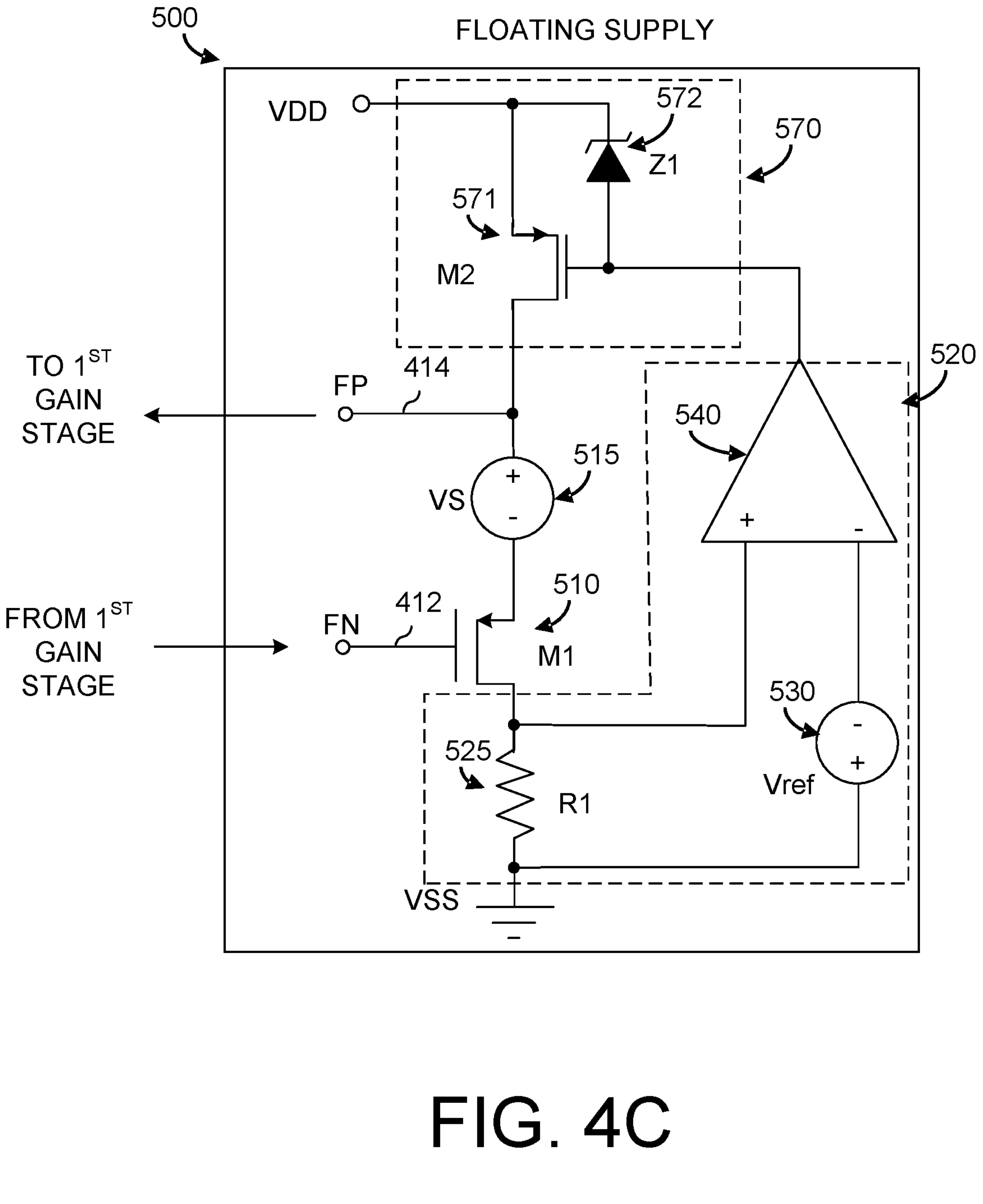
FIG. 4C is a schematic of a floating supply for the operational amplifier of FIG. 1 according to a third possible implementation of the present disclosure.

FIG. 4C is a schematic of a floating supply for the operational amplifier of FIG. 1 according to a third possible implementation. The third implementation is the complement of the first implementation, shown in FIG. 4A.

As shown in FIG. 4C, the floating supply 500 is powered by the upper rail voltage (VDD) and the lower rail voltage (VSS) of the fixed power supply. The floating supply 500 includes an input transistor 510. As shown, the input transistor 510 can be a PMOS transistor. The input transistor 510 is coupled at its gate to the common source node 412 of the first gain stage 410. Accordingly, a negative voltage (FN), at the common source node 412, can be received at the gate of the input transistor 510. The input transistor 510 is coupled at its drain to the lower rail voltage (VSS) via a bias resistor 525 and is coupled at its source to a voltage source 515 (VS), which is configured to set the differential voltage of the floating supply. The voltage source 515 can be set to a low voltage. The positive voltage (FP) generated at the floating node 414 can be given by the equation below.

$$FP = FN + VGS + VS \tag{3}$$

In the equation above, VGS is the gate to source voltage of the input transistor 510 and VS is the voltage of the voltage source, which can be in the LV range (e.g., 3-5V). The positive voltage (FP) is received at the floating supply 500 from the input stage 400. The negative voltage (FN) is transmitted from the floating supply 500 to the floating node of the first gain stage 410.

As shown in FIG. 4C, the floating supply includes the control circuit 520 and the regulation device 570. These operate as described previously for the first implementation (i.e., FIG. 4A) but are oriented oppositely between the upper rail voltage (VDD) and the lower rail voltage (VSS).

Figure 4D:
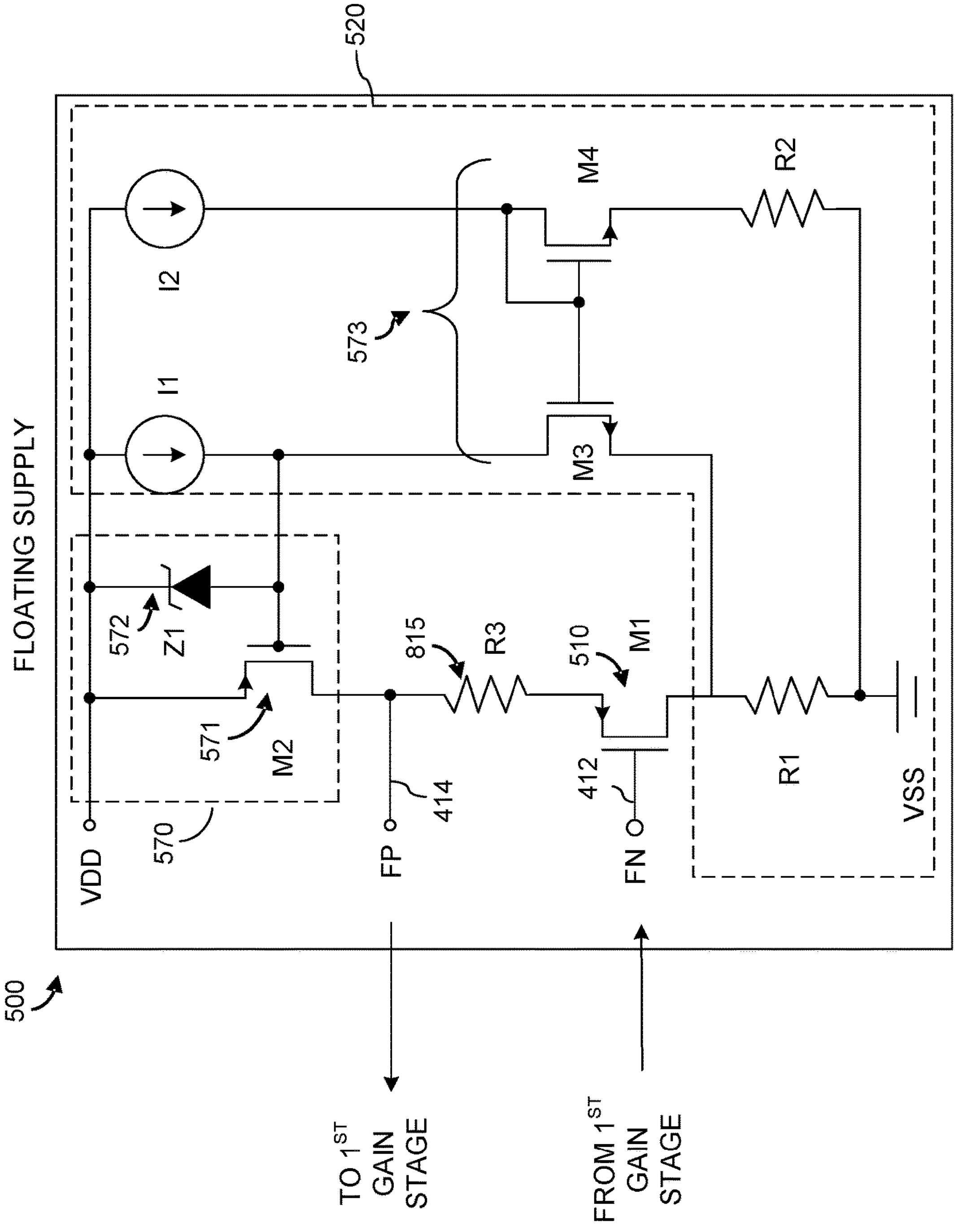
FIG. 4D is a schematic of a floating supply for the operational amplifier of FIG. 1 according to a fourth possible implementation of the present disclosure.

FIG. 4D is a schematic of a floating supply for the operational amplifier of FIG. 1 according to a fourth possible implementation. The floating supply of the fourth implementation is the complement of the floating supply of the second implementation (FIG. 4B) and includes a control circuit 520 that is implemented differently than the third implementation (FIG. 4C).

In the specification and/or figures, typical embodiments have been disclosed. The present disclosure is not limited to such exemplary embodiments. For example, variations may be conceived by replacing PMOS transistors with NMOS transistors in complementary circuits, and vice versa. Additionally, various implementations of the voltage sources or the current sources shown in the circuits are within the scope of the present disclosure.

The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. An input stage for an operational amplifier, the input stage comprising:

a first gain stage including:

a first field effect transistor coupled at a first gate to a positive input of the operational amplifier; and a second field effect transistor coupled at a second gate to a negative input of the operational amplifier; and a second gain stage including:

a first bipolar transistor coupled at a first emitter to a negative output of the first gain stage and coupled at a first collector to a negative output of the input stage;

a second bipolar transistor coupled at a second emitter to a positive output of the first gain stage and coupled at a second collector to a positive output of the input stage; and an active load coupled to the first collector and the second collector, the active load including a pair of bipolar transistors and a pair of resistors coupled to respective emitters of the pair of bipolar transistors.

2. The input stage for the operational amplifier according to claim 1, wherein:

a first base of the first bipolar transistor is directly connected to a second base of the second bipolar transistor, a connection between the first base and the second base forming a bias node for the second gain stage.

3. The input stage for the operational amplifier according to claim 2, wherein:

the bias node for the second gain stage is at a voltage that floats relative to a voltage of the first gain stage.

4. The input stage for the operational amplifier according to claim 1, wherein the first gain stage is inverting, and the second gain stage is non-inverting.

5. The input stage for the operational amplifier according to claim 1, wherein the second gain stage further includes:

a first cascode transistor coupled between the first collector and the negative output of the input stage; and a second cascode transistor coupled between the second collector and the positive output of the input stage.

6. The input stage for the operational amplifier according to claim 1, wherein:

a first source of the first field effect transistor is directly coupled to a second source of the second field effect transistor, a connection between the first source and the second source forming a common source node of the first gain stage;

a first drain of the first field effect transistor is coupled to a floating node of the first gain stage via first resistor; and a second drain of the second field effect transistor is coupled to the floating node of the first gain stage via a second resistor, the common source node and the floating node coupled to a floating supply.

7. The input stage for the operational amplifier according to claim 6, wherein:

the first field effect transistor and the second field effect transistor are PMOS transistors; and the input stage is configured to transmit a positive voltage (FP) from the common source node to the floating supply and receive a negative voltage (FN) from the floating supply at the floating node, the negative voltage (FN) lower than the positive voltage (FP) by a low-voltage supply voltage.

8. The input stage for the operational amplifier according to claim 7, further comprising a current source configured to supply current to the common source node from an upper rail.

9. The input stage for the operational amplifier according to claim 6, wherein:

the first field effect transistor and the second field effect transistor are NMOS transistors; and the input stage is configured to transmit a negative voltage (FN) from the common source node to the floating supply and receive a positive voltage (FP) from the floating supply at the floating node, the positive voltage (FP) higher than the negative voltage (FN) by a low voltage.

10. The input stage for the operational amplifier according to claim 9, further comprising a current source configured to drain current from the common source node to a lower rail.

11. The input stage for the operational amplifier according to claim 1, wherein the active load is coupled to the first collector of the first bipolar transistor and the second collector of the second bipolar transistor.

12. The input stage for the operational amplifier according to claim 11, wherein:

the first bipolar transistor and the second bipolar transistor are NPN transistors; and the active load is coupled between an upper rail voltage (VDD) and the first bipolar transistor and the second bipolar transistor.

13. The input stage for the operational amplifier according to claim 1, wherein:

the first bipolar transistor and the second bipolar transistor are PNP transistors; and the active load is coupled between a lower rail voltage (GND) and the first bipolar transistor and the second bipolar transistor.

14. The input stage for the operational amplifier according to claim 11, wherein the pair of bipolar transistors and the pair of resistors of the active load include:

a third bipolar transistor coupled at a third emitter to a third resistor and coupled at a third collector to the negative output of the input stage, and a fourth bipolar transistor coupled at a fourth emitter to a fourth resistor and coupled at a fourth collector to the positive output of the input stage.

15. An operational amplifier including:

an input stage including:

a first differential pair including field effect transistors source terminals connected together at a common source node of the input stage, a voltage at the common source node corresponding to an input voltage of the operational amplifier;

a pair of resistors coupled between drain terminals of the first differential pair of field effect transistors, the pair of resistors connected together at a floating node of the input stage; and a second different pair including bipolar transistors coupled at emitter terminals to the pair of resistors and connected together at a common base node of the input stage; and a floating supply configured to receive the voltage at the common source node and generate a relative voltage at the floating node.

16. The operational amplifier according to claim 15, wherein the voltage at the common source node and the relative voltage at the floating node power the first differential pair with a low voltage range that floats according to the input voltage of the operational amplifier.

17. The operational amplifier according to claim 16, wherein the input voltage of the operational amplifier is in a high voltage range.

18. The operational amplifier according to claim 16, wherein the floating supply includes:

an input transistor coupled at a gate terminal to the common source node to receive the voltage at the common source node;

a voltage device coupled between a source terminal of the input transistor and the floating node to generate the relative voltage at the floating node that is offset from the voltage at the common source node; and a regulator circuit coupled configured to sense a conduction of the input transistor and based on the conduction, control a current at the floating node.

19. The operational amplifier according to claim 18, wherein:

the input transistor is a NMOS transistor and the voltage at the common source node is a negative voltage that powers the first differential pair; and the regulator circuit includes a NMOS bias transistor configured to conduct current from the floating node to a lower rail of the operational amplifier based on the conduction of the input transistor.

20. The operational amplifier according to claim 18, wherein:

the input transistor is a PMOS transistor and the voltage at the common source node is a positive voltage that powers the first differential pair; and the regulator circuit includes a PMOS bias transistor configured to conduct current to the floating node from an upper rail of the operational amplifier based on the conduction of the input transistor.

* * * * *